(12) United States Patent
Suzuki et al.

(10) Patent No.: US 11,094,503 B2
(45) Date of Patent: Aug. 17, 2021

(54) METHOD OF PREPARING THIN FILM SAMPLE PIECE AND CHARGED PARTICLE BEAM APPARATUS

(71) Applicant: HITACHI HIGH-TECH SCIENCE CORPORATION, Tokyo (JP)

(72) Inventors: Masato Suzuki, Tokyo (JP); Ikuko Nakatani, Tokyo (JP); Satoshi Tomimatsu, Tokyo (JP); Makoto Sato, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 16/790,450

(22) Filed: Feb. 13, 2020

(65) Prior Publication Data

US 2020/0266031 A1 Aug. 20, 2020

(30) Foreign Application Priority Data

Feb. 14, 2019 (JP) .............................. JP2019-024865

(51) Int. Cl.
*H01J 37/00* (2006.01)
*H01J 37/30* (2006.01)

(52) U.S. Cl.
CPC ... *H01J 37/3005* (2013.01); *H01J 2237/2007* (2013.01); *H01J 2237/208* (2013.01); *H01J 2237/31745* (2013.01); *H01J 2237/31749* (2013.01)

(58) Field of Classification Search
USPC ........................................................ 250/307
See application file for complete search history.

(56) References Cited

U.S. PATENT DOCUMENTS

| | | | | |
|---|---|---|---|---|
| 6,538,254 B1 * | 3/2003 | Tomimatsu | .......... | H01J 37/3056 250/442.11 |
| 6,664,552 B2 * | 12/2003 | Shichi | ................ | B23K 15/0006 250/307 |
| 7,872,230 B2 * | 1/2011 | Ohnishi | ............. | G01N 23/2255 250/309 |
| 9,449,786 B2 * | 9/2016 | Tsuchiya | .................... | B25J 7/00 |

FOREIGN PATENT DOCUMENTS

| | | |
|---|---|---|
| JP | 2009110745 A | 5/2009 |
| JP | 2016050853 A | 4/2016 |

* cited by examiner

*Primary Examiner* — Phillip A Johnston
(74) *Attorney, Agent, or Firm* — Holland & Hart LLP

(57) ABSTRACT

Provided are a thin film sample creation method and a charged particle beam apparatus capable of preventing a thin film sample piece from being damaged. The method includes a process of processing a sample by irradiating a surface of the sample with a focused ion beam (FIB) from a second direction that crosses a normal line to the surface of the sample to create a thin film sample piece and a connection portion positioned at and connected to one side of the thin film sample piece, a process of rotating the sample around the normal line, a process of connecting the thin film sample piece to a needle for holding the thin film sample piece, and a process of separating the thin film sample piece from the sample by irradiating the connection portion with a focused ion beam from a third direction that crosses the normal line.

9 Claims, 8 Drawing Sheets

METHOD OF PREPARING THIN FILM SAMPLE PIECE AND CHARGED PARTICLE BEAM APPARATUS

CROSS REFERENCE TO RELATED APPLICATION

The present application claims priority to Japanese Patent Application No. 2019-024865, filed Feb. 14, 2019, the entire contents of which is incorporated herein for all purposes by this reference.

BACKGROUND OF THE INVENTION

1. Field of the Invention

The present invention relates to a method of preparing a thin film sample piece and a charged particle beam apparatus.

2. Description of the Related Art

Conventionally, there is known a technique in which fault analysis for a semiconductor device or a semiconductor element (for example, a dynamic random accessory memory (DRAM) element, a non-volatile memory element, or a solid state imagery) is performed by observing the microscopic cross-sectional structure of the semiconductor device or semiconductor element with a transmission electron microscope (TEM). Generally, in the case of performing TEM observation, a TEM sample is prepared by taking a tiny thin film sample piece from a sample to be observed and fixing the thin film sample piece to a sample holder (refer to Patent Documents 1 and 2).

Here, a conventional method of preparing a TEM sample will be briefly described.

First, an etching process is performed on a sample by irradiating a portion of the sample with a focused ion beam (FIB) which is a kind of charged particle beam. Through this process, a thin film sample piece with a thickness of several tens to hundred nm is prepared. At this time, the thin film sample piece is not completely separated from the sample. That is, the thin film sample piece is still connected to the sample via a connection portion. Next, the thin film sample piece is held by a needle or nano-tweezers. In a case where a needle is used, the tip of the needle is irradiated with a FIB while a source gas for a deposition film is supplied to the tip of the needle so that the deposition film is formed in the vicinity of the tip of the needle. That is, specifically, the source gas for formation of the deposition film is decomposed by secondary electrons generated due to the FIB irradiation, and the deposition film is formed to connect the tip of the needle and the thin film sample piece, resulting in the thin film sample piece being fixed to and supported on the tip of the needle by the deposition film.

After the thin film sample piece is attached to the tip of the needle via the deposition film, the connection portion between the thin film sample piece and the sample is etched through FIB irradiation. That is, the connection portion is cut so that the thin film sample piece can be separated from the sample. Next, the thin film sample piece is removed from the sample in a state in which the thin film sample piece is held by the needle or the micro-tweezers. Next, a stage is moved such that a sample holder is positioned directly below the thin film sample piece, and then the thin film sample piece is moved to stay near the top surface or the side surface of the sample holder. Next, a focused ion beam is emitted to a clearance between the thin film sample piece and the sample holder while a source gas is supplied to the clearance. Through this process, a deposition film is formed between the thin film sample piece and the sample holder so that the thin film sample piece can be fixed to the sample holder via the deposition film.

DOCUMENT OF RELATED ART

Patent Document (Patent Document 1) Japanese Patent Publication No. 2016-050853

(Patent Document 2) Japanese Patent Publication No. 2009-110745

SUMMARY OF THE INVENTION

When separating a thin film sample piece from a sample by emitting a focused ion beam to a connection portion, there is a risk that the thin film sample piece is partially removed.

An objective of the present invention is to provide a method of preparing a thin film sample piece and a charged particle beam apparatus which are capable of preventing a thin film sample piece from being partially removed.

In order to solve the above problems, according to one aspect, there is provided a method of preparing a thin film sample piece from a sample whose thickness direction is along a surface of a sample, from the sample, the method including: preparing the thin film sample piece by processing the sample by irradiation of a charged particle beam from a first direction, which is a direction of a normal line to the surface of the sample, and from a second direction intersecting the direction of the normal line and preparing a connection portion, which is placed on one side of the thickness direction of the thin film sample piece and connecting the thin film sample piece to the sample; rotating the sample around the direction of the normal line; connecting a holding member, which holds the thin film sample piece to the thin film sample piece; and separating the thin film sample piece from the sample by irradiating the connection portion with a charged particle beam in a third direction intersecting the direction of the normal line.

According to another aspect, there is provided a charged particle beam apparatus for preparing a thin film sample piece whose thickness direction is along a surface of a sample, from the sample, the apparatus including: a charged particle beam radiation optical system for emitting at least one charged particle beam in a direction intersecting a vertical direction; a stage moving with the sample mounted thereon; a holding member holding the thin film sample piece separated and removed from the sample; and a controller for controlling operation of the charged particle beam radiation optical system, the stage, and the holding member, wherein the controller performs control to prepare the thin film sample piece by processing the sample by irradiating the sample with charged particle beam from a first direction, which is a direction of a normal line to the surface of the sample, and from a second direction intersecting the direction of the normal line and a connection portion placed on one side of the thin film sample piece in a thickness direction of the thin film sample piece and connecting the thin film sample piece to the sample, wherein the holding member is connected to the thin film sample piece, and wherein the connection portion is irradiated with charged particle beam in a third direction intersecting the direction of the normal line to separate the thin film sample piece the sample.

The controller may perform control such that the thin film sample piece and the connection portion are prepared by irradiating the sample with the charged particle beam in the second direction intersecting the direction of the normal line. The controller may perform control such that the sample is rotated, a holding member is connected to the thin film sample piece, and the connection portion is irradiated with the charged particle beam in the third direction intersecting the direction of the normal line. The connection portion may be provided at one side of the thin film sample piece in the thickness direction of the thin film sample piece. Therefore, although the charged particle beam is emitted in the third direction, only the connection portion can be irradiated with the charged particle beam. Therefore, it is possible to suppress the thin film sample piece from being damaged.

The controller may perform control to irradiate the connection portion with charged particle beam from the third direction and performs surface processing of a cross-section in the thickness direction of the thin film sample piece where the connection portion is disposed.

Through this process, a structure that is provided in the thin film sample piece is exposed on the cross section of the thin film sample piece, enabling a target position on the cross section to be observed to be specified. Therefore, it is not necessary to perform additional surface processing such as a cleaning process after the thin film sample piece is separated from the sample. Therefore, a processing time required for the preparation of the thin film sample piece can be reduced.

When one side of the two sides of the thin film sample piece in the thickness direction is input as a position at which the connection portion is to be prepared, the controller may perform control such that the connection portion is formed on the side that is input.

Therefore, the connection portion can be prepared at a desired side of the sides of the thin film sample piece. Specifically, in a case where the connection portion is irradiated with the charged particle beam and the cross-section processing is performed on the thin film sample piece, a structure provided in the thin film sample piece become visible through the process. Therefore, it is possible to specify a target position in the cross section to be observed by preparing the connection portion on the desired side of the sides of the thin film sample piece.

The third direction may be a direction in parallel to the cross section of the thin film sample piece, the cross section being formed near one side of the thin film sample piece in the thickness direction.

Even in this case, since it is possible to irradiate only the connection portion with the charged particle beam, damage to the thin film sample piece can be suppressed. In particular, when a surface treatment is performed on the cross section of the thin film sample piece as well as the connection portion is irradiated with the charged particle beam, the cross-section processing can be performed with high precision.

In the case of the thin film sample piece preparing method and the charged particle beam apparatus according to the present invention, the connection portion that connects the thin film sample piece to the sample is formed at one side of the thin film sample piece in the thickness direction. Thus, even when the charged particle beam is emitted in the third direction, only the connection portion can be irradiated with the charged particle beam, thereby suppressing the thin film sample piece being damaged.

DESCRIPTION OF THE PREFERRED EMBODIMENTS

Hereinafter, a charged particle beam apparatus and a thin film sample piece preparing method according to one embodiment will be described with reference to the accompanying drawings.

(Charged Particle Beam Apparatus)

Figure 1:
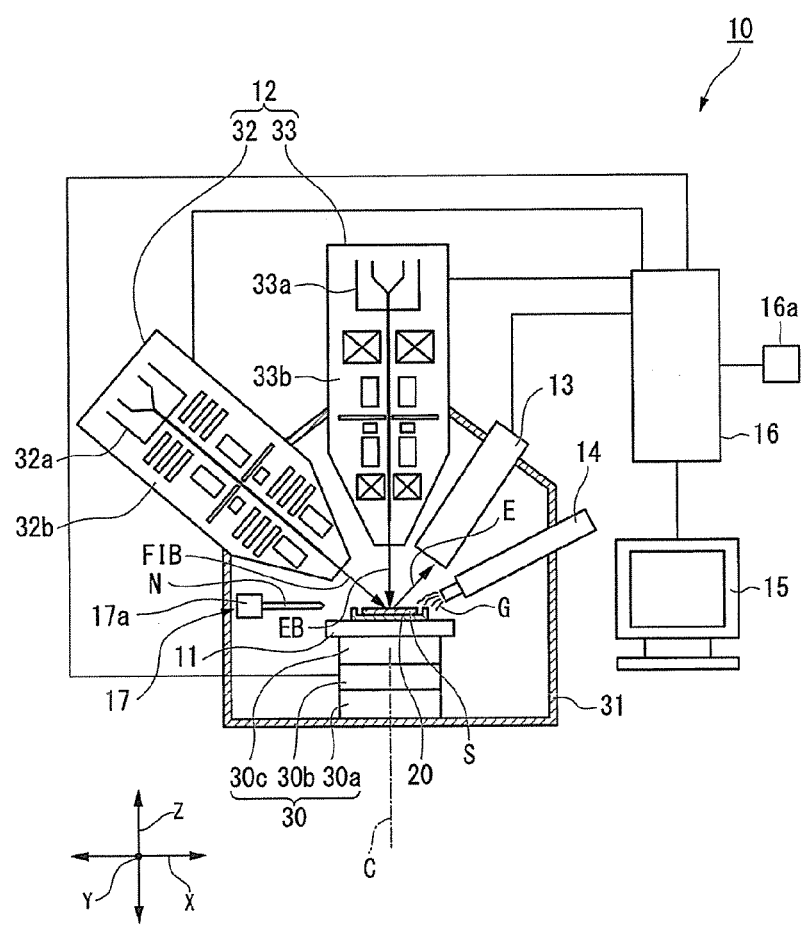
FIG. 1 is a schematic configuration diagram of a charged particle beam apparatus according to one embodiment.

FIG. 1 is a schematic configuration diagram of a charged particle beam apparatus according to one embodiment. A charged particle beam apparatus 10 according to one embodiment can automatically generate a thin film sample piece 1 from a sample S. The charged particle beam apparatus 10 includes a stage 11 on which the sample S is to be placed, a radiation mechanism 12 for emitting a focused ion beam (FIB) and an electron beam (EB), a detector 13 for detecting secondary charged particles E generated through FIB or EB irradiation, a gas gun 14 for supplying a source gas G for forming a deposition film D, a controller 16 for generating image data on the basis of the detected secondary charged particles E and for displaying the image data on a display unit 15, and a needle N serving as a holding member for holding the thin film sample piece 1.

The sample S is placed on the stage 11 in a state of being fixed to a holder 20.

The stage 11 is operated according to the instructions issued by the controller 16 and is configured to perform five-axis displacements. That is, the stage 11 is supported on a displacement mechanism 30 including: a linear movement mechanism 30a for linearly moving the holder 20 in X, Y, and Z axes in which the X and Y axes are parallel to the horizontal surface and are perpendicular to each other and the Z axis is perpendicular to each of the X and Y axes; a tilting mechanism 30b for tilting the holder 20 by rotating the holder 20 around the X axis or the Y axis; and a rotation mechanism 30c for rotating the holder 20 around the Z axis.

Therefore, by displacing the stage 11 along five axes with the displacement mechanism 30, the FIB or the EB can be directed toward a desired position. The stage 11 and the displacement mechanism 30 are accommodated in a vacuum chamber 31. Therefore, the emission of the FIB or EB, the supply of the source gas G, etc. are performed in the vacuum chamber 31.

The radiation mechanism 12 is positioned above the stage 11. The radiation mechanism 12 is composed of an FIB radiation optical system (charged particle beam radiation optical system) 32 which emits a focused ion beam (FIB) in a direction intersecting the direction of the Z axis (vertical direction) and an SEM optical system 33 which emits an electron beam (EB) in a direction in parallel to the Z axis (vertical direction). The direction along the optical axis of the FIB radiation optical system 32 intersects the vertical direction. The direction along the optical axis of the FIB radiation optical system 32 intersects the perpendicular direction (normal direction) to the upper surface of the stage 11 that stays in a standard state. The standard state of the stage 11 refers to a state in which at least the tilting mechanism 30b of the displacement mechanism 30 is positioned at the origin. The direction along the optical axis of the FIB radiation optical system 32 intersects the direction of the central axis C of the vacuum chamber 31. On the other hand, the direction along the optical axis of the SEM optical system 33 coincides with the direction along the central axis C of the vacuum chamber 31. The electric field inside the vacuum chamber 31 is substantially axis-symmetrically generated with respect to the central axis C. Therefore, the SEM optical system 33 is improved in observation precision.

The FIB radiation optical system 32 includes an ion source 32a and an ion optical system 32b. Ions generated by the ion source 32a are concentrated by the ion optical system 32b so as to become a focused ion beam (FIB) that is to be directed toward the sample S or the sample holder. In addition, the SEM optical system 33 includes an electron source 33a and an electro-optical system 33b. Electrons are concentrated by the electro-optical system 33b so as to become an electron beam (EB) which is to be directed toward the sample S or the sample holder.

The detector 13 detects secondary charged particles E such as secondary electrons or secondary ions generated from the sample S or the sample holder when the sample S or the sample holder is irradiated with the FIB or EB and outputs the results of the detection to the controller 16.

The gas gun 14 is configured to supply the source gas G that is a chemical compound gas containing raw materials, such as phenanthrene, platinum, carbon, or tungsten, of the deposition film D. The source gas G is decomposed into gas components and solid components by the secondary charged particles E generated due to the FIB irradiation. The solid components are deposited to form the deposition film D.

The holding mechanism 17 includes: a needle movement mechanism 17a a base end of which is mounted on the vacuum chamber 31; and a needle N moved by the needle movement mechanism 17a. The needle movement mechanism 17a can linearly move the needle N in a horizontal direction and a vertical direction and rotate the needle N on the central axis of the needle N. With this configuration, the thin film sample piece 1 retained on the needle N can be freely moved.

The controller 16 controls the overall operation of the constituent members of the charged particle beam apparatus 10 and can change an acceleration voltage or a beam current for the FIB radiation optical system 32 and the SEM optical system 33. In particular, the controller 16 can freely control the beam diameter of the FIB by changing the acceleration voltage or the amount of beam. Thus, an observation image can be acquired, and the sample S can be locally etched. In addition, during the etching, it is possible to freely change precision of processing from coarse processing to finishing processing by adjusting the beam diameter.

In addition, the controller 16 generates data of an observation image by converting the secondary charged particles E generated by FIB or EB irradiation and detected by the detector 13 to a luminance signal, and outputs the observation image to the display unit 15 on the basis of the data of the observation image. Therefore, the observation image can be displayed on the display unit 15. In addition, the controller 16 is connected to an input unit 16a via which instructions or various settings information can be input by an operator. The controller 16 controls each constituent member according to the instructions or settings information input through the input unit 16a. That is, by inputting instructions or settings information to the controller 16 via the input unit 16a, the operator can observe a target region by irradiating the target region with an FIB or an EB, etches a target region by irradiating the target region with an FIB, or forms a deposition film D at a target region by irradiating the target region with an FIB while supplying a source gas to the desired target.

(Thin Film Sample Piece Preparing Method)

A thin film sample piece preparing method performed by using the charged particle beam apparatus 10 of the embodiment will be described below.

Figure 2:
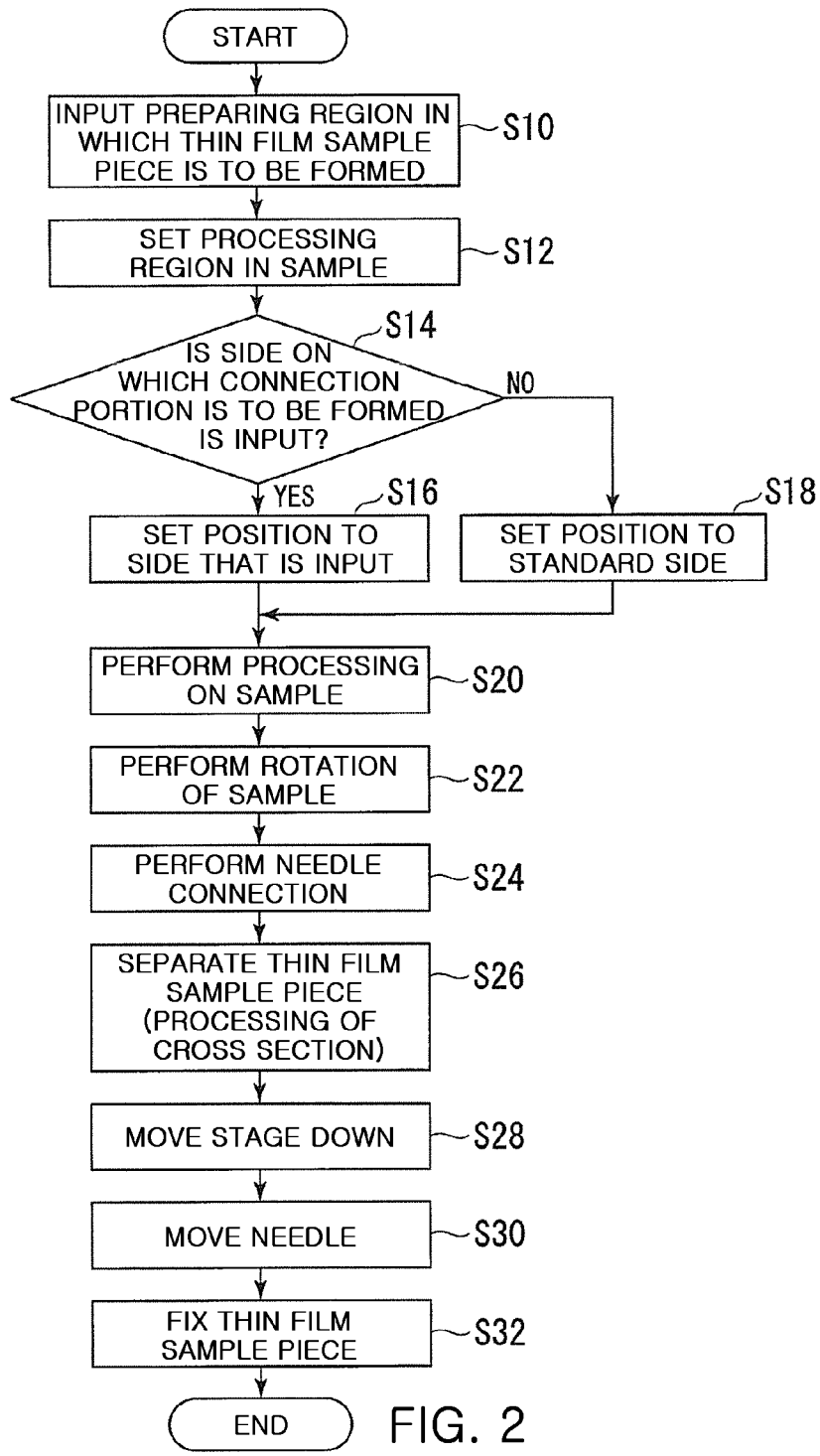
FIG. 2 is a flowchart of a thin film sample piece preparing method according to one embodiment.
Figure 3:
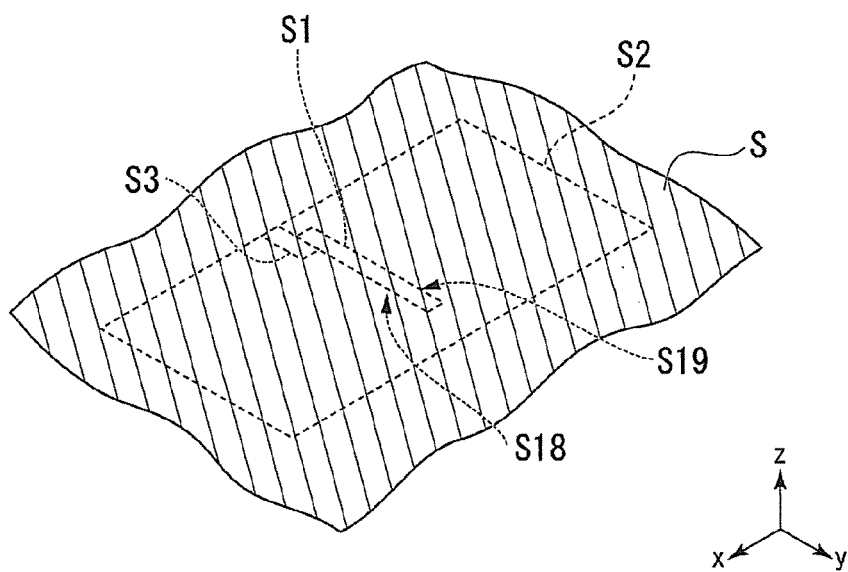
FIG. 3 is a first explanatory view of a thin film sample piece preparing method according to one embodiment.
Figure 4:
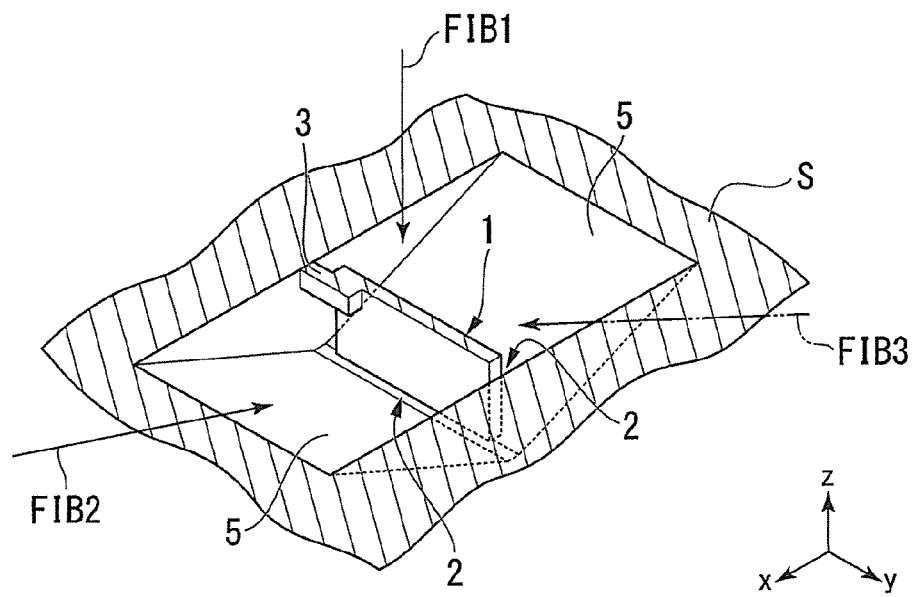
FIG. 4 is a second explanatory view of a thin film sample piece preparing method according to one embodiment.

FIG. 2 is a flowchart of a thin film sample piece preparing method according to one embodiment. FIG. 3 is a first explanatory view of a thin film sample piece preparing method according to one embodiment. FIG. 4 is a second explanatory view. In the present disclosure, an x direction, a y direction, and a z direction in Cartesian coordinate are defined as below. The z direction is a direction along a normal line to the surface of the sample S, in which a +z direction refers to a direction in which the distance from the surface of the sample S is increased along the normal line. The x direction refers to a thickness direction in which the thickness of the thin film sample piece 1 is measured. They direction refers to a width direction in which the width of the thin film sample piece 1 is measured and is orthogonal to the z direction and the x direction.

The thin film sample piece 1 is used to observe structures such as semiconductor elements included in the sample S. As illustrated in FIG. 4, the thin film sample piece 1 is taken off from the surface of the sample S. The thin film sample piece 1 has a thickness measured in the x direction along the surface of the sample S. The thin film sample piece 1 has a predetermined width measured in they direction along the surface of the sample S. The thin film sample piece 1 has a predetermined depth (i.e., height) measured in the −z direction from the surface of the sample S.

The operator inputs information indicating a first preparing region in which the thin film sample piece 1 is to be formed through the input unit 16a in Step S10. For example, the operator inputs information indicating a center point of the preparing region S1 of the thin film sample piece 1 on the surface of the sample S. The operator inputs the dimensions of the sample S in the x direction, the y direction, and the z direction. Thus, as illustrated in FIG. 3, the first preparing region S1 in which the thin film sample piece 1 is to be formed is set. On the display unit 15, the image of the surface of the sample S and the shape of the fist preparing region S1 in which the thin film sample piece 1 is to be formed are displayed in a superimposed manner.

The controller 16 sets a processing region S2 corresponding to the first preparing region S1, within the sample S in step S12. As illustrated in FIG. 4, in order to separate the thin film sample piece 1 from the sample S, a slit 2 is formed to extend in the ±y directions and the −z direction. In order to form the slit 2, inclined surfaces 5 of the thin film sample piece 1 are formed along ±x-direction of the thin film sample piece 1. Each of the inclined surfaces 5 is configured to connect a position on the surface of the sample S which is away from the thin film sample piece 1 in the ±x direction and a position in the −z direction of the thin film sample piece 1. Each of the inclined surfaces 5 has a width (i.e., y-direction dimension) larger than that of the thin film sample piece 1. For example, the inclination angle of the inclined surfaces 5 with respect to the z direction is the same as the inclination angle of the optical axis of the FIB radiation optical system 32 with respect to the vertical direction. The controller 16, as illustrated in FIG. 3, sets a second preparing region in which the inclined surfaces 5 are to be formed as the processing region S2 of the sample S. The display unit 15 displays the image of the surface of the sample S and the shape of the processing region S2 in a superimposed manner.

The controller 16 sets a third preparing region S3 in which the connection portion 3 is to be formed. As illustrated in FIG. 4, the connection portion 3 functions to connect the thin film sample piece 1 and the sample S to each other before the thin film sample piece 1 is separated. As will be described later in detail, the connection portion 3 is connected between the sample S and the thin film sample piece 1 during a process in which the needle N is connected to the thin film sample piece 1. The connection portion 3 partially overlaps the region of the slit 2. The connection portion 3 is formed at the corner (of the y-direction and the z-direction) of the thin film sample piece 1. Hereinbelow, specifically, an example in which the connection portion 3 is formed at the corner (of the −y direction and the +z direction) of the thin film sample piece 1 will be described. The sizes (i.e., thickness in the x direction, the length in the y direction, and the height in the z direction) of the connection portion 3 are preset to predetermined values.

The connection portion 3 is formed at a first side (i.e., +x direction side) or a second side (i.e., −x direction side) of the thin film sample piece 1 in the x direction. As illustrated in FIG. 3, the third preparing region S3 in which the connection portion 3 is to be formed is set to be close to the first preparing region S1 in which the thin film sample piece 1 is to be formed in terms of the x direction.

The controller 16 receives an input of one side of the first and second sides S18 and S19 of the thin film sample piece 1 in the x direction at which the connection portion 3 is to be formed. For example, the controller 16 displays a message on the display unit 15 to require the operator to input the side S18 or S19 at which the connection portion 3 is to be formed. The operator input the side at which the connection portion 3 is to be formed. As will be described below, when the connection portion 3 is removed, a cleaning process is performed to clean the cross section of the thin film sample piece 1 at the side which the connection portion 3 is removed. Therefore, the operator inputs one side of the +x direction side and the −x direction side of the thin film sample piece 1 as the side (i.e., position) at which the connection portion 3 is to be formed. That is, the side (position) at which the connection portion 3 is to be formed means the side (position) to be observed.

The controller 16 determines whether the side at which the connection portion 3 is to be formed is input in Step S14.

When an affirmative determination is made in Step S14 (Yes in S14), the third preparing region S3 in which the connection portion 3 is to be formed is set to the side (position) that is input in Step S16. When a negative determination is made in Step S14 (No in S14), the controller 16 sets the third preparing region S3 in which the connection portion 3 is to be formed to a standard side that is preliminarily registered in Step S18. For example, the preliminarily registered standard side is a side that is opposite to a needle contact side which is to come into contact with the needle N, in the x direction. Therefore, when the connection portion 3 is irradiated with a focused ion beam for the removal of the connection portion 3, a risk that the needle N is accidently irradiated with the FIB is reduced. On the display unit 15, the image of the surface of the sample S and the shape of the set third preparing region S3 in which the connection portion 3 is to be formed are displayed in a superimposed manner. Hereinbelow, an example in which the connection portion 3 is formed on the +x direction side S18 of the thin film sample piece 1 will be described.

The controller 16 controls the FIB radiation optical system 32 to process the sample S in Step S20.

The processing sequence will be described in detail below. As illustrated in FIG. 4, the controller 16 drives the displacement mechanism 13 of the stage 11 such that the direction (z direction) along the normal line to the surface of the sample S coincides with the direction along the optical axis of the FIB radiation optical system. The controller 16 controls the FIB radiation optical system to emit a focused ion beam FIB1 in the z direction (first direction). The controller 16 controls the FIB radiation optical system to emit the focused ion beam FIB 1 to the processing region S2 of the sample S except for the first preparing region S1 in which the thin film sample piece 1 is to be formed and the third preparing region S3 in which the connection portion 3 is to be formed. The processing depth in the z direction from the surface of the sample S is adjusted according to the intensity or irradiation duration of the focused ion beam FIB1. In this process, the thin film sample piece 1 having a predetermined thickness is formed, and the +x and −x inclined surfaces 5 are formed along both the +x direction side and the direction −x side of the thin film sample piece 1.

The controller 16 drives the displacement mechanism 30 of the stage 11 such that the stage 11 enters a standard state. In the standard state, the direction (z direction) along the normal line to the surface of the sample S coincides with the vertical direction and intersects the direction along the optical axis of the FIB radiation optical system 32. The controller 16 controls the FIB radiation optical system 32 to emit a focused ion beam FIB2 in a second direction intersecting the z direction. The focused ion beam FIB2 is emitted to the surroundings of the thin film sample piece 1 except for the third preparing region in which the connection portion 3 is to be formed under control of the controller 16. Through this process, the outline of the thin film sample piece 1 is written and the slit 2 is formed around the thin film sample piece 1.

The controller 16 drives the rotation mechanism 30c of the displacement mechanism 30 of the stage 11, thereby rotating the stage 11 on which the sample S is placed in Step S22. The controller 16 performs control such that the stage 11 is rotated around the vertical direction while being maintained in the standard state. The controller 16 performs control such that the sample S is rotated around the normal line (z direction). The controller 16 performs control such that the stage 11 is rotated by an angle of 90°. In this state, the FIB radiation optical system 32 emits a focused ion beam FIB3 to the sample S in a third direction intersecting the z direction. The third direction in which the focused ion beam FIB3 is emitted is parallel to the cross section of the thin film sample piece 1, which is disposed at one side in the x direction of the thin film sample piece 1, unlike the second direction that is the same as the direction in which the second focused ion beam FIB2 is emitted.

The rotation of the stage 11 is performed for the reason described below. The controller 16 performs control such that the thin film sample piece 1 is connected to the needle N and the thin film sample piece 1 is then separated from the sample S after the thin film sample piece 1 is formed through the irradiation of the focused ion beam FIB2 emitted in the second direction. The controller 16 performs control such that the needle N is moved and the thin film sample piece 1 is fixed to the sample holder to have a predetermined orientation. In a case where the stage 11 is rotated before the needle N is connected to the thin film sample piece 1, the movement of the needle N performed after the separation of the thin film sample piece 1 is simplified. That is, with only the rotation of the needle N on the central axis and the linear movement of the needle N, the thin film sample piece 1 can be fixed to the sample holder to have a predetermined orientation.

Figure 5:
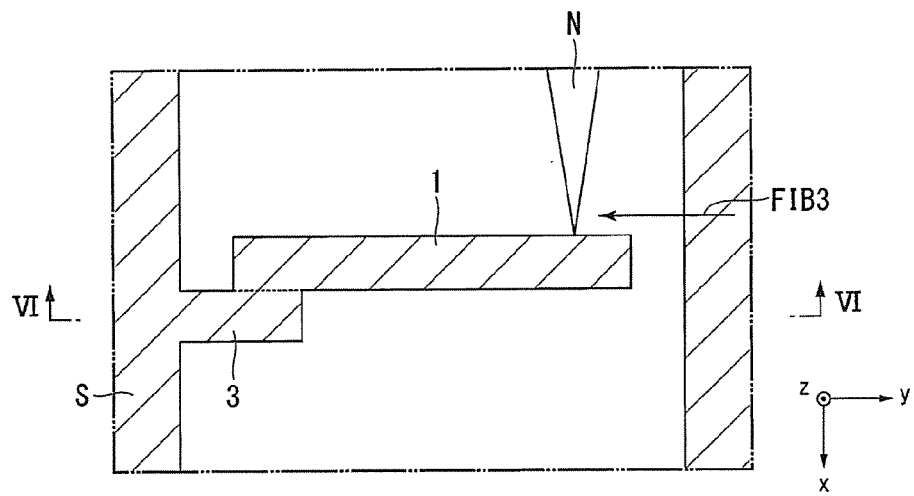
FIG. 5 is a third explanatory view of a thin film sample piece preparing method according to one embodiment.
Figure 6:
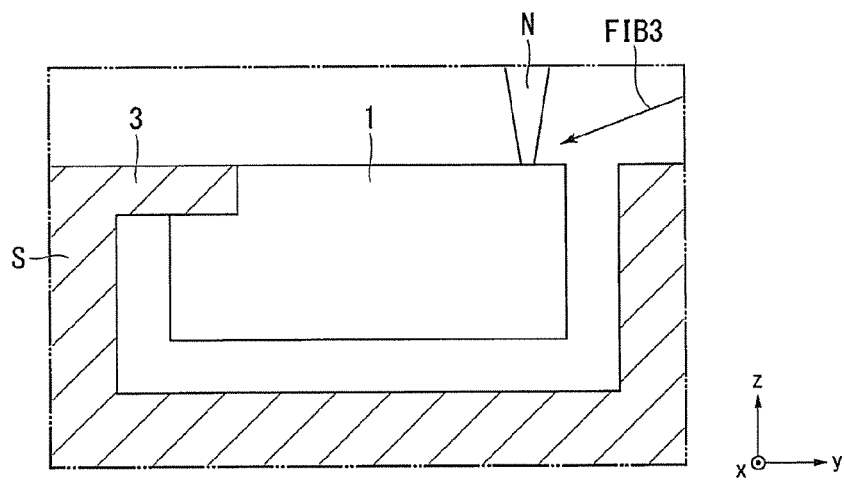
FIG. 6 is a cross-sectional view taken along a line VI-VI of FIG. 5.

FIG. 5 is a third explanatory view of a thin film sample piece preparing method according to one embodiment. FIG. 5 is a plan view of a sample S and FIG. 6 is a cross-sectional view taken along a line VI-VI of FIG. 5. The controller 16 performs control such that the needle N is connected to the thin film sample piece 1 in Step S24. The tip of the needle N approaches the thin film sample piece 1 in a state of being orthogonal to they direction and being oriented to face the +x direction and the −z direction. The tip of the needle N approaches the corner (of the +y direction and the +z direction) of the thin film sample piece 1 in the −x direction. The controller 16 performs control such that a source gas G for a deposition film is supplied toward the tip of the needle N from the gas gun 14. The controller 16 performs control such that the tip of the needle N is irradiated with the focused ion beam FIB3. Through this process, a deposition film is formed between the tip of the needle N and the thin film sample piece 1 so that the tip of the needle N is connected to the thin film sample piece 1.

Figure 7:
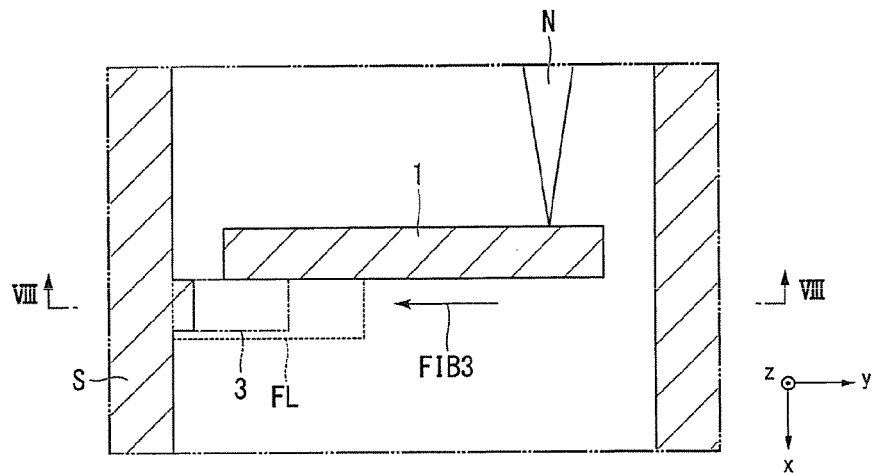
FIG. 7 is a fourth explanatory view of a thin film sample piece preparing method according to one embodiment.
Figure 8:
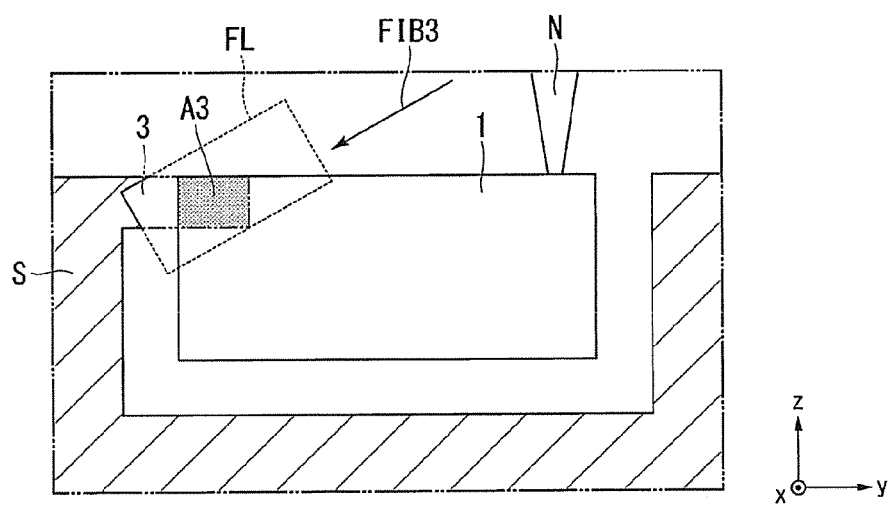
FIG. 8 is a cross-sectional view taken along a line VIII-VIII of FIG. 7.

FIG. 7 is a fourth explanatory view of a thin film sample piece preparing method according to one embodiment. FIG. 7 is a plan view of the sample S and FIG. 8 is a cross-sectional view taken along a line VIII-VIII of FIG. 7. The controller 16 performs control such that the connection portion 3 is irradiated with the focused ion beam FIB3 for the removal of the connection portion 3. Thus, the thin film sample piece 1 is separated from the sample S in Step s26. The processing sequence will be described in detail below. The controller 16 sets an irradiation range FL for the FIB3 irradiation. As illustrated in FIG. 8, the irradiation range FL has a rectangular shape elongated in parallel with the direction in which the third focused ion beam FIB3 is emitted when viewed in the x direction. The size of the irradiation range FL is set to include an overlapping area A3 of the thin film sample piece 1 and the connection portion 3 when viewed in the x-direction. As illustrated in FIG. 7, the size of the irradiation range FL is set to include the thickness (x-direction length) of the connection portion 3 when viewed in the z direction.

The controller 16 performs control such that the focused ion beam FIB3 is emitted to a region within the irradiation range FL. When the connection portion 3 in at least the overlapping area A3 is removed through the FIB3 irradiation, the thin film sample piece 1 is separated from the sample S. The focused ion beam FIB3 is emitted in a direction in parallel to the cross section, on one x-direction side, of the thin film sample piece 1 as described above. The connection portion 3 is closer to the +x direction-side surface of the thin film sample piece 1 than the −x direction-side surface. Therefore, it is possible to irradiate only the connection portion 3 with the focused ion beam FIB3 while preventing the thin film sample piece 1 from being irradiated with the focused ion beam FIB3. Therefore, damage to the thin film sample piece 1 can be suppressed.

The controller 16 drives the linear movement mechanism 30a of the displacement mechanism 30 of the stage 11 to move the stage 11 vertically downward in Step S28. Thereby, the sample S mounted on the stage 11 is moved away from the thin film sample piece 1 held by the needle N. The controller 16 drives the needle movement mechanism 17a to move the needle N in Step S30. The controller 16 rotates the needle N around the central axis of the needle N. As a result, the orientation of the thin film sample piece 1 is changed to a predetermined orientation. The controller 16 linearly moves the needle N toward the sample holder. The controller 16 fixes the thin film sample piece 1 orientated in a predetermined direction to the sample holder in Step S32. Here, the preparing of the thin film sample piece is finished.

Figure 9:
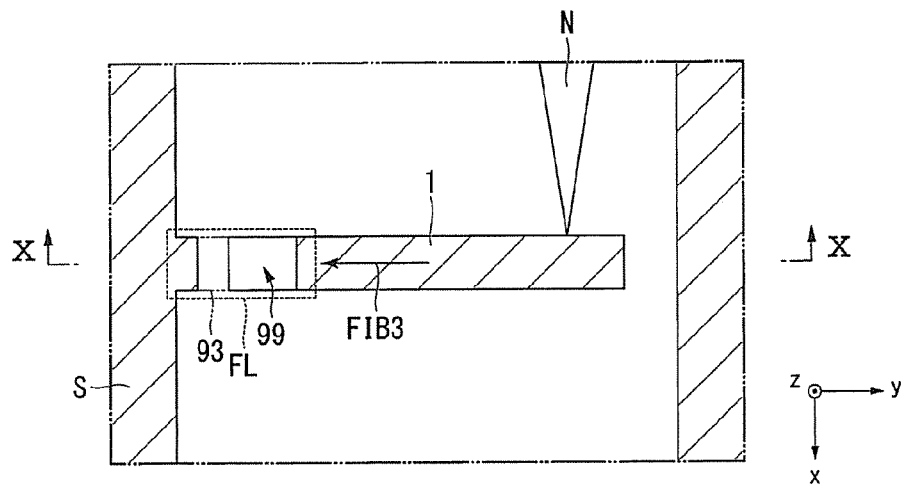
FIG. 9 is an explanatory view of a thin film sample piece preparing method according to a comparative example.
Figure 10:
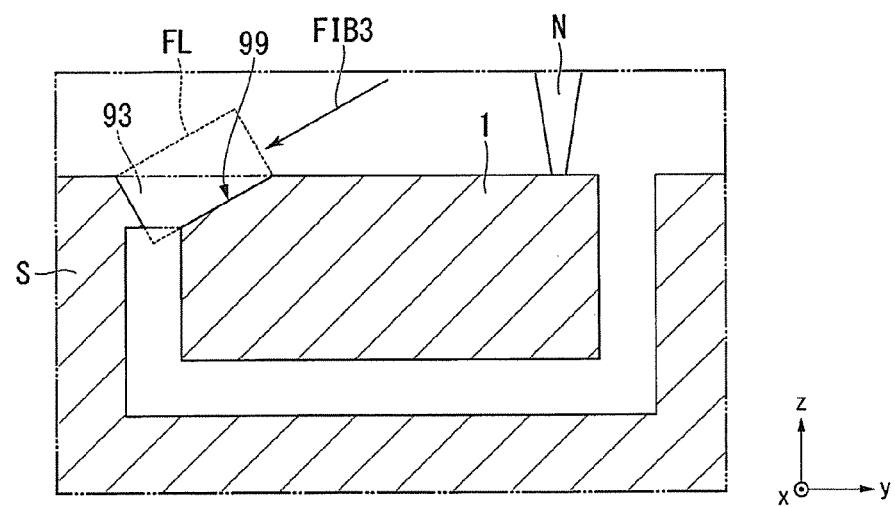
FIG. 10 is a cross-sectional view taken along a line X-X of FIG. 9.

FIG. 9 is an explanatory view of a thin film sample piece preparing method according to a comparative example. FIG. 9 is a plan view of a sample S. FIG. 10 is a cross-sectional view taken along a line X-X of FIG. 9. As illustrated in FIG. 9, in the comparative example, a connection portion 93 and a thin film sample piece 1 are formed at the same x coordinate. The connection portion 93 is formed at a −y direction side of the thin film sample piece 1. As illustrated in FIG. 10, the controller 16 performs control such that a focused ion beam FIB3 is emitted to fall within an irradiation range FL. Through this process, the connection portion 93 is removed, and the thin film sample piece 1 is separated from the sample S. In this case, the focused ion beam FIB3 is emitted in a direction in parallel to a cross section, formed on one side in the x direction, of the thin film sample piece 1. Therefore, a portion of the focused ion beam FIB3 is incident on the thin film sample piece 1 before reaching the connection portion 93, whereby a portion 99 of the thin film sample piece 1 may be removed.

On the other hand, in the case of the charged particle beam apparatus and the thin film sample piece preparing method according to one embodiment of the present invention, as illustrated in FIG. 7, the connection portion 3 is formed on one side of the thin film sample piece 1 in terms of the x direction. Therefore, when the focused ion beam is emitted in the third direction, only the connection portion 3 can be irradiated with the focused ion beam FIB3. Therefore, it is possible to prevent the thin film sample piece 1 from damaged.

(Modification)

Figure 11:
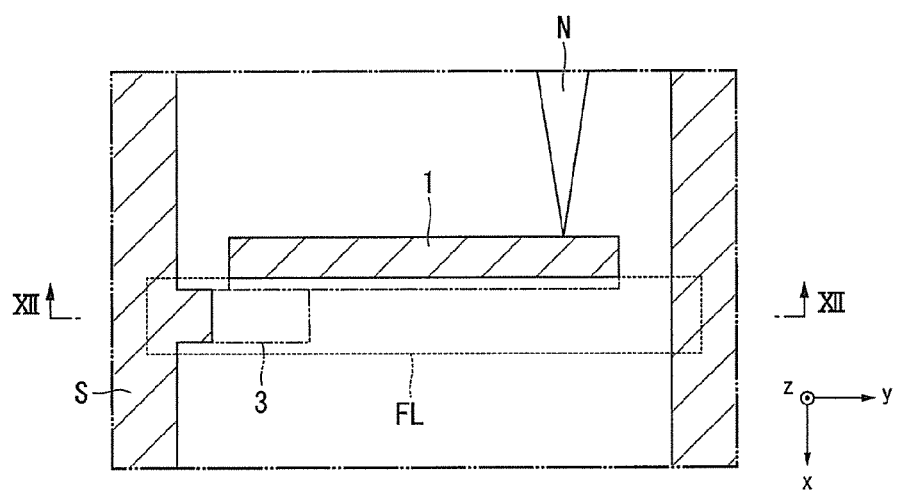
FIG. 11 is an explanatory view of a thin film sample piece preparing method according to a first modification of the embodiment.
Figure 12:
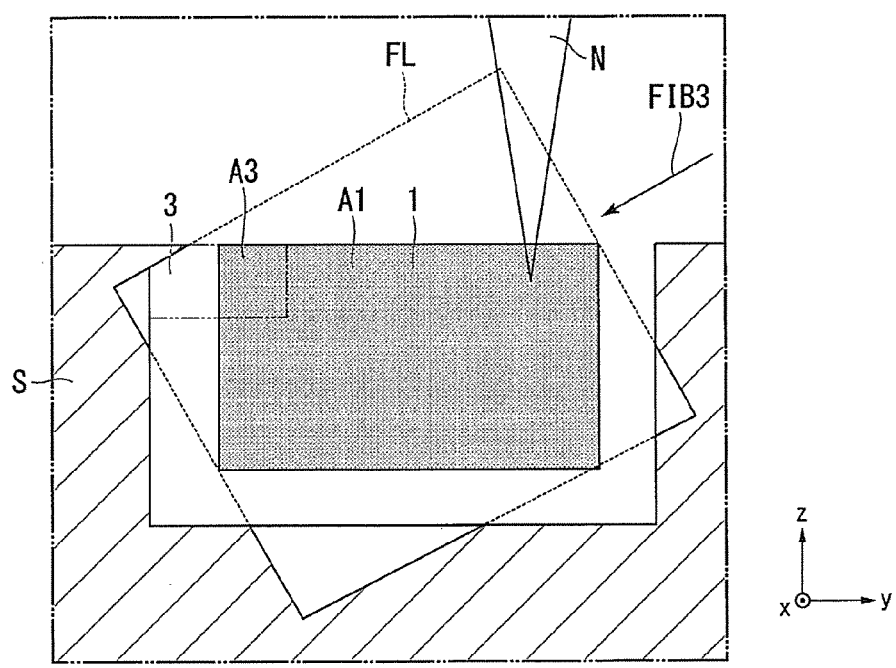
FIG. 12 is a cross-sectional view taken along a line XII-XII of FIG. 11.

FIG. 11 is a plan view of a sample S, which is illustrated for description of a method of preparing a thin film sample piece according to a modification of the embodiment. FIG. 12 is a cross-sectional view taken along a line XII-XII of FIG. 11. According to this modification, a controller 16 performs control such that a focused ion beam FIB3 is emitted to a connection portion 3 and a cross section, on one side in the x direction, of the thin film sample piece 1 is processed in Step S26.

The sequence of processes will be described in detail below. The controller 16 sets an irradiation range FL in which the FIB3 irradiation is to be performed. As illustrated in FIG. 12, the irradiation range FL is set to include the entire area A1 of the cross section formed on one side in the x direction of the thin film sample piece, when viewed in the x-direction. The entire area A1 of the cross section of the thin film sample piece 1 includes an overlapping area A3 in which the thin film sample piece 1 and the connection portion 3 overlap. As illustrated in FIG. 11, the irradiation range FL is set to have a size including the entire thickness (x-direction size) of the connection portion 3 and the +x direction size of the cross section of the thin film sample piece 1, when viewed in the z-direction.

The controller 16 performs control such that the irradiation of the focused ion beam FIB3 occurs within the irradiation range FL. When the connection portion 3 within the overlapping area S3 is removed through the irradiation of the focused ion beam FIB3, the thin film sample piece 1 is separated from the sample S. The focused ion beam FIB3 is also emitted to the cross section (on the +x direction side) of the thin film sample piece 1. Therefore, the cross section (on the +x direction side) of the thin film sample piece 1 can be cleaned (cross-sectional surface processing). At the time of processing the sample S, contaminants are likely to be attached to the cross section (on the +x direction side) of the thin film sample piece 1. By performing the cleaning process, the contaminants on the cross section are removed. Due to the cross-section processing (i.e., cleaning), structures included in the thin film sample piece 1 are exposed to be visible from the outside. Thus, a target position in the cross section to be observed can be specified.

As described above, in the case of the charged particle beam apparatus and the thin film sample piece preparing method according to the modification, the controller 16 performs control such that the connection portion 3 is irradiated with the focused ion beam FIB3 and a surface processing of the x direction-side cross section of the thin film sample piece is performed on the side at which the connection portion 3 is disposed. In this case, it is not necessary to perform an additional surface processing such as cleaning process after the thin film sample piece 1 is separated from the S. Therefore, a processing time required for preparing of the thin film sample piece 1 is shortened.

In the embodiment described above, the controller 16 performs control such that when one side of two sides of the thin film sample piece 1 in the x direction is input as a position at which the connection portion 3 is to be formed, the connection portion 3 is prepared at the side that is input.

Therefore, the connection portion 3 can be formed at a selected side of the thin film sample piece 1 as intended by the operator. In addition, in the case where the surface processing of the cross section is performed during the removal of the connection portion 3 as described in the modification, the structures included in the thin film sample piece 1 are exposed to be visible from the outside. Therefore, one side of the thin film sample piece, to be observed through the cross-section processing, is input as the side at which the connection portion 3 is to be formed. With this method, one side of the thin film sample piece, connected to the connection portion, is processed to form a cross section, and a target position to be observed is specified within the cross section.

In the embodiment, the third direction in which the focused ion beam is emitted is parallel to the cross section formed on one side of the thin film sample piece in the x direction.

Even in this case, it is possible to irradiate only the connection portion 3 with the focused ion beam FIB3, thereby suppressing the thin film sample piece 1 being damaged. In addition, in the case where the surface processing of the cross section is performed as described in the modification, the entire area A1 of the cross section is uniformly irradiated with the focused ion beam FIB3 so that the surface processing of the cross section can be performed with high precision.

Although an embodiment of the present invention have been described in detail with reference to the accompanying drawings, the configuration of the preset invention is not limited to the embodiment, and changes in the configuration and combinations or deletions of some elements in the configuration, which can be made without departing from the gist of the disclosure, will fall within the scope of the present invention.

What is claimed is:

1. A method of preparing a thin film sample piece, whose thickness direction is along a surface of a sample, from the sample, the method including:
    preparing the thin film sample piece and a connection portion, which is placed on one side of the thickness direction of the thin film sample piece and connecting the thin film sample piece to the sample, by processing the sample by irradiation of a charged particle beam from a first direction, which is a direction of a normal line to the surface of the sample, and from a second direction intersecting the direction of the normal line to form inclined surfaces along the thickness direction of the thin film and a slit along the direction of the normal line and a width direction of the thin film;
    rotating the sample around direction of the normal line;
    connecting a holding member, which holds the thin film sample piece to the thin film sample piece; and
    separating the thin film sample piece from the sample by irradiating the connection portion with a third charged particle beam from a third direction intersecting the direction of the normal line, wherein the connection portion extends along the width direction of the thin film such that the connection portion overlaps a region of the slit.

2. A charged particle beam apparatus for preparing a thin film sample piece, whose thickness direction is along a surface of a sample, the apparatus comprising:
    a charged particle beam radiation optical system for emitting a charged particle beam along a direction intersecting a vertical direction;
    a stage moving with the sample placed thereon;
    a holding member holding the thin film sample piece separated and removed from the sample; and
    a controller for controlling operation of the charged particle beam radiation optical system, the stage, and the holding member,
    wherein the controller controls to prepare the thin film sample piece and a connection portion placed on one side of the thin film sample piece in a thickness direction of the thin film sample piece and connecting the thin film sample piece to the sample, by irradiating the sample with charged particle beam from a first direction, which is a direction of a normal line to the surface of the sample, and from a second direction intersecting the direction of the normal line to form inclined surfaces along the thickness direction of the thin film and a slit along the direction of the normal line and a width direction of the thin film, wherein the stage is rotated around the direction of the normal line, wherein the holding member is connected to the thin film sample piece;

wherein the connection portion is irradiated with charged particle beam from a third direction intersecting the direction of the normal line to separate the thin film sample piece from the sample; and wherein the connection portion extends along the width direction of the thin film such that the connection portion overlaps a region of the slit.

3. The charged particle beam apparatus according to claim 2, wherein the controller controls to irradiate the connection portion with charged particle beam from the third direction, and to perform surface processing of a cross-section in the thickness direction of the thin film sample piece where the connection portion is disposed.

4. The charged particle beam apparatus according to claim 2, the controller controls to prepare the connection portion on an inputted side among two sides in the thickness direction of the thin film sample piece in case a side to prepare the connection portion is inputted.

5. The charged particle beam apparatus according to claim 3, the controller controls to prepare the connection portion on an inputted side among two sides in the thickness direction of the thin film sample piece in case a side to prepare the connection portion is inputted.

6. The charged particle beam apparatus according to any one of claim 2, wherein the third direction is a direction in parallel to a cross-section of the thin film sample piece in the thickness direction.

7. The charged particle beam apparatus according to any one of claim 3, wherein the third direction is a direction in parallel to a cross-section of the thin film sample piece in the thickness direction.

8. The charged particle beam apparatus according to any one of claim 4, wherein the third direction is a direction in parallel to a cross-section of the thin film sample piece in the thickness direction.

9. The charged particle beam apparatus according to any one of claim 5, wherein the third direction is a direction in parallel to a cross-section of the thin film sample piece in the thickness direction.

* * * * *